(12) United States Patent
Gholamipour et al.

(10) Patent No.: US 10,379,950 B2
(45) Date of Patent: Aug. 13, 2019

(54) UPDATING WRITE-IN-PLACE STORAGE DEVICES

(71) Applicant: Western Digital Technologies, Inc., San Jose, CA (US)

(72) Inventors: Amir H. Gholamipour, Irvine, CA (US); Chandan Mishra, Sunnyvale, CA (US); Mai Ghaly, Bloomington, MN (US); Majid Nemati Anaraki, San Diego, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 5 days.

(21) Appl. No.: 15/828,425

(22) Filed: Nov. 30, 2017

(65) Prior Publication Data

US 2019/0163566 A1    May 30, 2019

(51) Int. Cl.
*G06F 11/10* (2006.01)
*G06F 3/06* (2006.01)
*G11C 29/52* (2006.01)

(52) U.S. Cl.
CPC .......... *G06F 11/1076* (2013.01); *G06F 3/065* (2013.01); *G06F 3/0619* (2013.01); *G06F 3/0689* (2013.01); *G06F 11/1068* (2013.01); *G11C 29/52* (2013.01)

(58) Field of Classification Search
CPC ............. G06F 11/1076; G06F 11/1068; G06F 3/0619; G06F 3/065; G06F 3/0689; G11C 29/52
See application file for complete search history.

(56) References Cited

U.S. PATENT DOCUMENTS

| | | | | |
|---|---|---|---|---|
| 5,651,132 A * | 7/1997 | Honda | ................... | G06F 3/0601 708/531 |
| 7,822,921 B2 * | 10/2010 | Taylor | ................... | G06F 3/0611 711/114 |
| 8,484,415 B2 * | 7/2013 | Cho | ........................ | G06F 3/061 711/103 |
| 8,495,460 B2 * | 7/2013 | Flynn | .................... | G06F 11/073 714/758 |
| 8,645,749 B2 * | 2/2014 | Reche | ................... | G06F 11/108 714/6.1 |
| 2006/0123270 A1 * | 6/2006 | Forhan | ................ | G06F 11/1076 714/6.2 |
| 2008/0282105 A1 * | 11/2008 | Deenadhayalan | .. | G06F 11/1076 714/6.12 |
| 2009/0172335 A1 * | 7/2009 | Kulkarni | ................. | G06F 3/061 711/170 |

(Continued)

*Primary Examiner* — Cynthia Britt
(74) *Attorney, Agent, or Firm* — Kunzler Bean & Adamson, PC

(57) ABSTRACT

Systems, apparatuses, methods, and computer program products are disclosed for updating data of write-in-place storage devices. One system includes a write-in-place memory device including a redundant storage structure and a controller for the memory device. A memory device is configured to store data across a set of stripes of a redundant storage structure. A controller is configured to receive updated data for a dataset stored across a first stripe, generate a new parity for the dataset based on the updated data, overwrite the dataset across the first stripe with the updated data, and/or write the new parity to the set of stripes.

20 Claims, 6 Drawing Sheets

(56) References Cited

U.S. PATENT DOCUMENTS

| | | | | |
|---|---|---|---|---|
| 2015/0095696 A1* | 4/2015 | Hess | ................. | G06F 11/108 |
| | | | | 714/6.24 |
| 2015/0106563 A1* | 4/2015 | Hsu-Hung | ............ | G06F 3/0614 |
| | | | | 711/114 |
| 2016/0110255 A1* | 4/2016 | Yun | .................... | G06F 11/1012 |
| | | | | 714/766 |
| 2016/0371145 A1* | 12/2016 | Akutsu | ................ | G06F 3/0619 |
| 2017/0123995 A1* | 5/2017 | Freyensee | ............... | G06F 12/10 |
| 2018/0074898 A1* | 3/2018 | Wang | .................. | G06F 3/0617 |

* cited by examiner

UPDATING WRITE-IN-PLACE STORAGE DEVICES

TECHNICAL FIELD

The present disclosure, in various embodiments, relates to storage operations and more particularly relates to updating data of write-in-place storage devices with reduced read overhead and improved reliability of stored logical data.

BACKGROUND

Some conventional storage devices use a redundant array of independent disks (RAID) structure that is capable of redundantly storing data and updating the data stored therein. To update data that is stored in a RAID structure of a conventional storage device, both the old data and the old parity information for the data are read from the storage device(s), a new parity is generated, and both the new data and the new parity are written back or re-written to the storage device(s). Therefore, there is a factor of read overhead and write overhead in operations that update data stored in conventional storage devices configured with a RAID structure.

SUMMARY

Systems for updating data of write-in-place storage devices are presented. In one embodiment, a write-in-place memory device comprising a redundant storage structure in which the memory device is configured to store data across a set of stripes of the redundant storage structure. A controller for a memory device, in certain embodiments, is configured to receive updated data for a dataset stored across a first stripe, generate a new parity for the dataset based on the updated data, overwrite the dataset across the first stripe with the updated data, and/or write the new parity to the set of stripes.

Apparatuses for updating data of write-in-place storage devices are presented. In one embodiment, an apparatus includes means for receiving an updated dataset for a dataset stored across a first stripe in a redundant array of independent disks (RAID) structure of a random access memory (RAM) device. An apparatus, in some embodiments, includes means for generating a new parity for a dataset based on an updated dataset. In certain embodiments, an apparatus includes means for over-writing a dataset across a first stripe with an updated dataset. An apparatus, in one embodiment, includes means for writing a new parity to a set of stripes.

Also presented are methods for updating data of write-in-place storage devices. A method, in one embodiment, includes receiving, via a controller, an updated dataset for a dataset stored across a first stripe in a redundant array structure of a random access memory device. A method, in certain embodiments, includes generating a new parity for a dataset based on an updated dataset. A method, in some embodiments, includes over-writing a dataset across a first stripe with an updated dataset. In one embodiment, a method includes writing a new parity to a set of stripes.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which.

DETAILED DESCRIPTION

Figure 1:
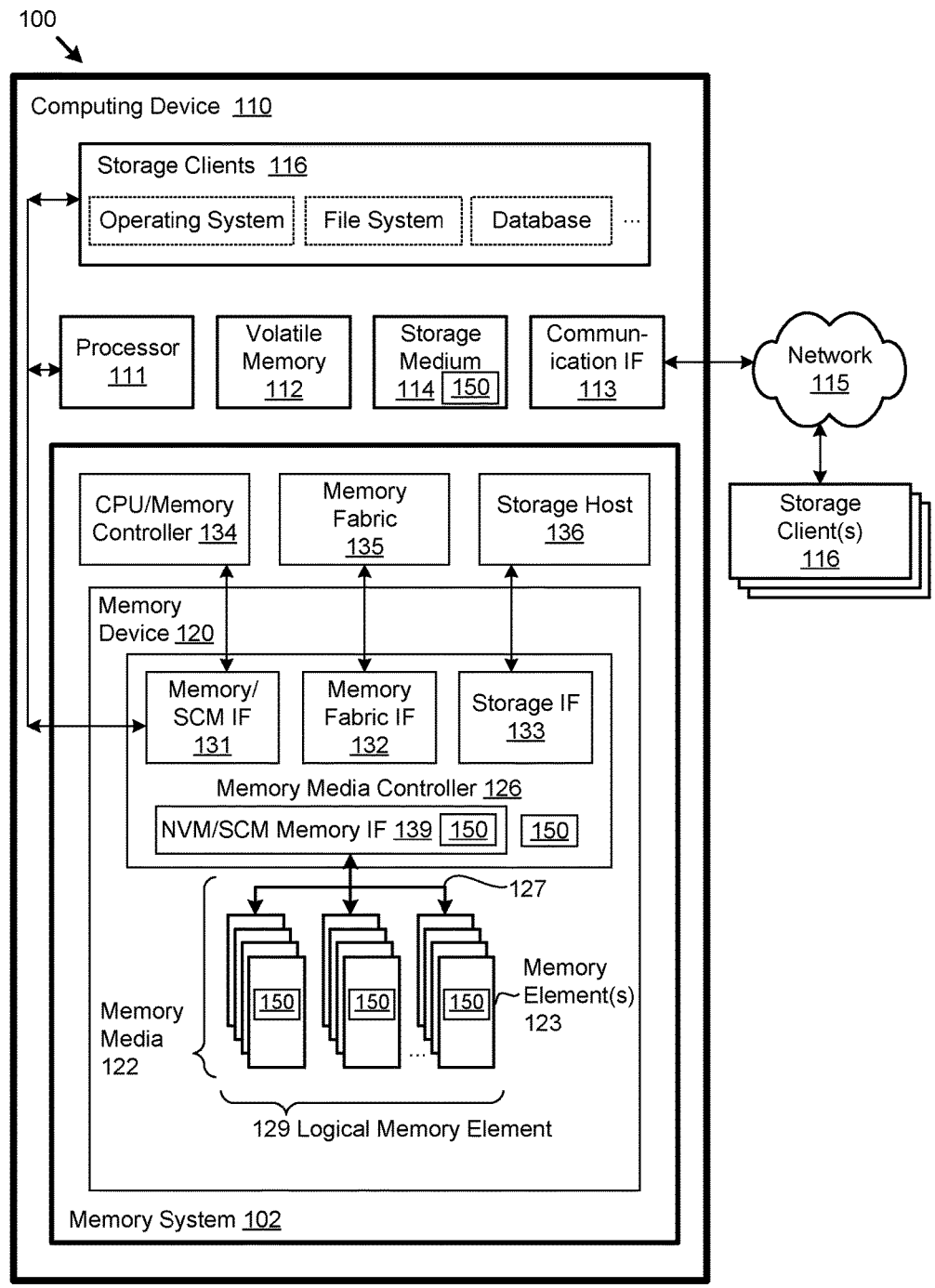
FIG. 1 is a schematic block diagram illustrating one embodiment of a system for updating data of write-in-place storage devices.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions that may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer readable and/or executable storage media. Any combination of one or more computer readable storage media may be utilized. A computer readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

A circuit, as used herein, comprises a set of one or more electrical and/or electronic components providing one or more pathways for electrical current. In certain embodiments, a circuit may include a return pathway for electrical current, so that the circuit is a closed loop. In another embodiment, however, a set of components that does not include a return pathway for electrical current may be referred to as a circuit (e.g., an open loop). For example, an integrated circuit may be referred to as a circuit regardless of whether the integrated circuit is coupled to ground (as a return pathway for electrical current) or not. In various embodiments, a circuit may include a portion of an integrated circuit, an integrated circuit, a set of integrated circuits, a set of non-integrated electrical and/or electrical components with or without integrated circuit devices, or the like. In one embodiment, a circuit may include custom VLSI circuits, gate arrays, logic circuits, or other integrated circuits; off-the-shelf semiconductors such as logic chips, transistors, or other discrete devices; and/or other mechanical or electrical devices. A circuit may also be implemented as a synthesized circuit in a programmable hardware device such as field programmable gate array, programmable array logic, programmable logic device, or the like (e.g., as firmware, a netlist, or the like). A circuit may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may be embodied by or implemented as a circuit.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

In addition, as used herein, the term "set" can mean "one or more," unless expressly specified otherwise. The term "sets" can mean multiples of or a plurality of "one or mores," "ones or more," and/or "ones or mores" consistent with set theory, unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

FIG. 1 is a block diagram of one embodiment of a computing system 100 comprising an update component 150 for a memory device 120 (e.g., a write-in-place memory device). The update component 150 may be part of and/or in communication with a memory media controller 126 (e.g., a non-volatile memory/storage class memory (NVM/SCM) media controller, or the like), one or more memory elements 123 (e.g., write-in-place memory elements), a NVM/SCM memory interface (IF) 139, or the like. The update component 150 may operate on a memory system 102 of a computing device 110, which may include a processor 111, volatile memory 112, and/or a communication IF 113. The processor 111 may comprise one or more central processing units (CPUs), one or more general-purpose processors, one or more application-specific processors, one or more virtual processors (e.g., the computing device 110 may be a virtual machine operating within a host), one or more processor cores, or the like. The communication interface (IF) 113 may comprise one or more network interfaces configured to communicatively couple the computing device 110 and/or memory media controller 126 to a communication network 115, such as an Internet Protocol (IP) network, a Storage Area Network (SAN), wireless network, wired network, and/or the like.

The memory media controller 126 communicates with memory elements 123 via a NVM/SCM Memory IF 139 including, for example, DDRx, Toggle, ONFI, or the like. A front end interface of the memory media controller 126 can communicate with the processor 111 (e.g., a host processor), a CPU/memory controller 134, and/or one or more storage clients 116 via a SCM/Memory IF 131. The SCM/Memory IF 131 can provide a bus operating with Double Data Rate transfers (e.g., DDRx, etc.), a connection via a Memory Fabric IF 132, and/or a connection via a Storage IF 133 to a Peripheral Component Interconnect (PCI) host, a PCI Express (PCIe) host, a Small Computer System Interface (SCSI) host, a Serial Attached SCSI (SAS) host, a Serial Advanced Technology Attachment (SATA) host, and/or the like host(s).

The memory device 120, in various embodiments, may be disposed in one or more different locations relative to the computing device 110. In one embodiment, the memory device 120 comprises one or more memory elements 123, such as semiconductor chips or packages or other integrated circuit devices disposed on one or more printed circuit boards, storage housings, and/or other mechanical and/or electrical support structures. For example, the memory device 120 may comprise one or more direct inline memory module (DIMM) cards, one or more expansion cards and/or daughter cards, a solid-state-drive (SSD) or other hard drive device, and/or may have another memory and/or storage form factor. The memory device 120 may be integrated with and/or mounted on a motherboard of the computing device 110, installed in a port and/or slot of the computing device 110, installed on a different computing device 110 and/or a dedicated storage appliance on the network 115, in communication with the computing device 110 over an external bus (e.g., an external hard drive), or the like.

The memory device 120, in one embodiment, may be disposed on a memory bus of a processor 111 (e.g., on the same memory bus as the volatile memory 112, on a different memory bus from the volatile memory 112, in place of the volatile memory 112, or the like). In a further embodiment, the memory device 120 may be disposed on a peripheral bus of the computing device 110, such as a PCI bus, a PCIe bus, a SATA bus, a parallel Advanced Technology Attachment (PATA) bus, a SCSI bus, a FireWire bus, a Fibre Channel connection, a Universal Serial Bus (USB), a PCIe Advanced Switching (PCIe-AS) bus, or the like. In another embodiment, the memory device 120 may be disposed on a data network 115, such as an Ethernet network, an Infiniband network, SCSI RDMA over a network 115, the Internet, a cloud network (IAN), a SAN (e.g., a storage area network, a small area network, a server area network, and/or a system area network), a wide area network (WAN), a local area network (LAN), a wireless local area network (WLAN), a metropolitan area network (MAN), an enterprise private network (EPN), a virtual private network (VPN), and/or a personal area network (PAN), among other examples of computing networks and/or or sets of computing devices connected together for the purpose of sharing resources.

The computing device 110 may further comprise a non-transitory, computer readable storage medium 114. The computer readable storage medium 114 may comprise executable instructions configured to cause the computing device 110 (e.g., processor 111) to perform processes, operations, and/or steps of one or more of the methods disclosed herein. Alternatively, or in addition, the update component 150 may be embodied as one or more computer-readable instructions stored on the non-transitory storage medium 114.

The memory system 102, in the depicted embodiment, includes an update component 150. The update component 150, in one embodiment, is configured to update and/or write additional data to a dataset stored in the memory device 120 described below. The update component 150, in certain embodiments, may receive the updated/additional data and calculate a parity for the updated/additional data, which includes the currently stored dataset. The update component 150 may over-write the currently stored dataset with the updated/additional data. The update component 150 may further over-write the current parity for the currently stored dataset with the parity (e.g., a new parity) for the updated/additional data.

Furthermore, the update component 150 can over-write the currently stored dataset with the updated/additional data without reading the currently stored dataset prior to such over-write operation(s). Similarly, the update component 150 can over-write the parity for the currently stored dataset with the parity (e.g., the new parity) for the updated/additional data without reading the parity for the currently stored dataset prior to such over-write operation(s). In this manner, the various embodiments of the update component 150 can eliminate, or at least reduce, read overhead when updating and/or adding data to a dataset that is currently being stored in the memory device 120 and/or when over-writing the current parity with a new parity.

In one embodiment, the update component 150 may comprise logic hardware of one or more memory devices 120, such as a memory media controller 126, a memory element 123, a device controller, a field-programmable gate array (FPGA) or other programmable logic, firmware for an FPGA or other programmable logic, microcode for execution on a microcontroller, an application-specific integrated circuit (ASIC), or the like. In another embodiment, the update component 150 may comprise executable software code, such as a device driver 125 or the like, stored on the computer readable storage medium 114 for execution on the processor 111. In a further embodiment, the update component 150 may include a combination of both executable software code and logic hardware.

In one embodiment, the update component 150 is configured to receive storage requests from a device driver 125 and/or other executable application on the Memory Fabric 135 or the like. The update component 150 may be further configured to transfer data to/from a device driver 125 (not shown) and/or storage clients 116 via the Memory/SCM IF 131. Accordingly, the update component 150, in some embodiments, may comprise and/or be in communication with one or more direct memory access (DMA) modules, remote DMA modules, bus controllers, bridges, buffers, and so on to facilitate the transfer of storage requests and associated data. In another embodiment, the update component 150 may receive storage requests as an API call from the storage client(s) 116 as an input-output control (IO-CTL) command, or the like.

According to various embodiments, a memory media controller 126 in communication with one or more update components 150 may manage one or more memory devices 120 and/or memory elements 123. The memory device(s) 120 may comprise recording, memory, and/or storage devices, such as solid-state storage device(s) and/or semiconductor storage device(s) that are arranged and/or partitioned into a plurality of addressable media storage locations. As used herein, a media storage location refers to any physical unit of memory (e.g., any quantity of physical storage media on a memory device 120). Memory units may include, but are not limited to: stripes, pages, memory divisions, blocks, sectors, collections or sets of physical storage locations (e.g., logical stripes, logical pages, logical blocks, etc.), or the like.

A device driver 125 and/or the memory media controller 126, in certain embodiments, may present a logical address space to the storage client(s) 116. As used herein, a logical address space refers to a logical representation of memory resources. The logical address space may comprise a plurality (e.g., a range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

A device driver 125 for the memory device 120 may maintain metadata, such as a logical to physical address mapping structure, to map logical addresses of the logical address space to media storage locations on the memory device(s) 120. A device driver 125 may be configured to provide storage services to one or more storage clients 116. A storage client 116 may include one or more local storage clients 116 operating on the computing device 110 and/or remote, one or more storage clients 116 accessible via the network 115 and/or communication IF 113. The storage clients 116 may include, but are not limited to: operating systems, file systems, database applications, server applications, kernel-level processes, user-level processes, applications, and/or the like.

A device driver 125 may be communicatively coupled to one or more memory devices 120. The one or more memory devices 120 may include different types of memory devices including, but not limited to: solid-state storage devices, semiconductor storage devices, SAN storage resources, or the like. The one or more memory devices 120 may comprise one or more respective memory media controllers 126 and memory media 122. A device driver 125 may provide access to the one or more memory devices 120 via a NVM/SCM Memory IF 139. Additionally, the metadata may be used to manage and/or track data operations performed through any of the Memory/SCM IF 131, Memory Fabric IF 132, Storage IF 133, NVM/SCM Memory IF 139, and/or other related interfaces.

The Storage IF 133 may expose storage and/or memory features of a storage host 136 accessible via a device driver 125 for the memory device 120. Also, in some embodiments, the Memory/SCM IF 131 presented to the storage client(s) 116 can provide access to data transformations implemented by the one or more memory devices 120 and/or the one or more memory media controllers 126.

A device driver 125 may present a logical address space to the storage clients 116 through one or more interfaces. As discussed above, the logical address space may include a plurality of logical addresses, each corresponding to respective media locations of the one or more memory devices 120. A device driver 125 may maintain metadata comprising any-to-any mappings between logical addresses and media locations, and/or the like.

A device driver 125 may further comprise and/or be in communication with a Memory/SCM IF 131 configured to transfer data, commands, and/or queries to the one or more memory devices 120 over a bus, which may include, but is not limited to: a memory bus of a processor 111, a PCIe bus, a SATA bus, a parallel ATA bus, a small computer system interface (SCSI), FireWire, Fibre Channel, a Universal Serial Bus (USB), a PCIe Advanced Switching (PCIe-AS) bus, a network 115, Infiniband, SCSI RDMA, or the like. The memory device interface 139 may communicate with the one or more memory devices 120 using IO-CTL command(s), IO-CTL command extension(s), remote direct memory access, and/or the like.

The communication IF 113 may comprise one or more network interfaces configured to communicatively couple the computing device 110 and/or the memory media controller 126 to a network 115 and/or to one or more remote, network-accessible storage clients 116. The storage clients 116 may include local storage clients 116 operating on the computing device 110 and/or remote, storage clients 116 accessible via the network 115 and/or the communication IF 113. The memory media controller 126 is part of and/or in communication with one or more memory devices 120. Although FIG. 1 depicts a single memory device 120, the disclosure is not limited in this regard and could be configured and/or adapted to incorporate any number of memory devices 120.

The memory device 120 may comprise one or more memory elements 123 of memory media 122, which may include a write-in-place memory. Examples of a write-in-place memory include, but are not limited to: Memristor memory, programmable metallization cell memory, phase-change memory (PCM, PCME, PRAM, PCRAM, ovonic unified memory, chalcogenide RAM, or C-RAM), random access memory (RAM), nano random access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), dynamic RAM (DRAM), static RAM (SRAM), resistive RAM (ReRAM), ferroelectric RAM (FRAM), magnetoresistive RAM (MRAM), carbon nanotube RAM (CNT-RAM), among other types of write-in-place memories that are possible and contemplated herein.

The one or more memory elements 123 of memory media 122, in certain embodiments, comprise storage class memory (SCM). In one embodiment, storage class memory is byte addressable. In further embodiments, storage class memory may have a lower cost, use less power, and/or have a higher storage density than DRAM and/or may offer one or more other benefits or improvements when compared to other technologies. For example, storage class memory may comprise one or more memory elements 123 of ReRAM, Memristor memory, programmable metallization cell memory, phase-change memory, nano RAM, nanocrystal wire-based memory, silicon-oxide based sub-10 nanometer process memory, graphene memory, SONOS memory, phase change memory, PMC memory, CBRAM, MRAM, CNT-RAM, and/or variations/combinations thereof.

While the memory media 122 is referred to herein as "memory media," in various embodiments, the memory media 122 may more generally comprise one or more recording media capable of recording data, which may be referred to as a memory medium, a storage medium, or the like. Further, the memory device 120, in various embodiments, may comprise a recording device, a memory device, a storage device, or the like.

The memory media 122 may comprise one or more memory elements 123, which may include, but are not limited to: chips, packages, planes, die, or the like. A memory media controller 126 may be configured to manage data operations on the memory media 122, and may comprise one or more processors, programmable processors (e.g., FPGAs), ASICs, micro-controllers, or the like. In some embodiments, the memory media controller 126 is configured to store data on and/or read data from the memory media 122, to transfer data to/from the memory device 120, and so on.

The memory media controller 126 may be communicatively coupled to the memory media 122 by way of the NVM/SCM Memory IF 139 and a bus 127. The bus 127 may comprise an input/output (I/O) bus for communicating data to/from the memory elements 123. The bus 127 may further comprise a control bus for communicating addressing and other command and control information to the memory elements 123. In some embodiments, the bus 127 may communicatively couple the memory elements 123 to the memory media controller 126 in parallel. This parallel access may allow the memory elements 123 to be managed as a group, forming a logical memory element 129. The logical memory element may be partitioned into respective logical memory units (e.g., logical stripes, logical pages) and/or logical memory divisions (e.g., logical blocks). The logical memory units may be formed by logically combining physical memory units of each of the memory elements.

The memory media controller 126 may organize a block of word lines within a memory element 123, in certain embodiments, using addresses of the word lines, such that the word lines are logically organized into a monotonically increasing sequence (e.g., decoding and/or translating addresses for word lines into a monotonically increasing sequence, or the like). In a further embodiment, word lines of a block within a memory element 123 may be physically arranged in a monotonically increasing sequence of word line addresses, with consecutively addressed word lines also being physically adjacent (e.g., WL0, WL1, WL2, . . . WLN).

The memory media controller 126 may comprise and/or be in communication with a device driver 125 executing on the computing device 110. A device driver 125 may provide storage services to the storage clients 116 via the Memory/SCM IF 131. In some embodiments, a device driver 125 provides a block-device I/O interface 131 through which storage clients 116 perform block-level I/O operations. Alternatively, or in addition, a device driver 125 may provide a SCM interface, which may provide other storage services to the storage clients 116. In some embodiments, the SCM interface may comprise extensions to a block device interface (e.g., storage clients 116 may access the SCM interface through extensions or additions to the block device interface). Alternatively, or in addition, the SCM interface may be provided as a separate API, service, and/or library.

A storage client 116 can be any computing hardware and/or software (e.g., a thick client, a thin client, or hybrid thereof) that is known or developed in the future that is capable of accessing computing system 100 via the network 115. A storage client 116, as part of its respective operation, may rely on sending I/O requests to the computing system 100 to write data, read data, and/or modify data, etc. For instance, a storage client 116 can transmit I/O requests to write, read, store, communicate, propagate, and/or transport instructions, data, computer programs, software, code, routines, etc., to the computing system 100. The computing system 100 can be accessed by the storage client(s) 116 and/or communication with the computing system 100 can be initiated by the storage client(s) 116 through a network socket utilizing one or more inter-process networking techniques. In various embodiments, the storage client(s) 116 and the computing system 100 may comprise at least a portion of a client-server model.

Figure 2:
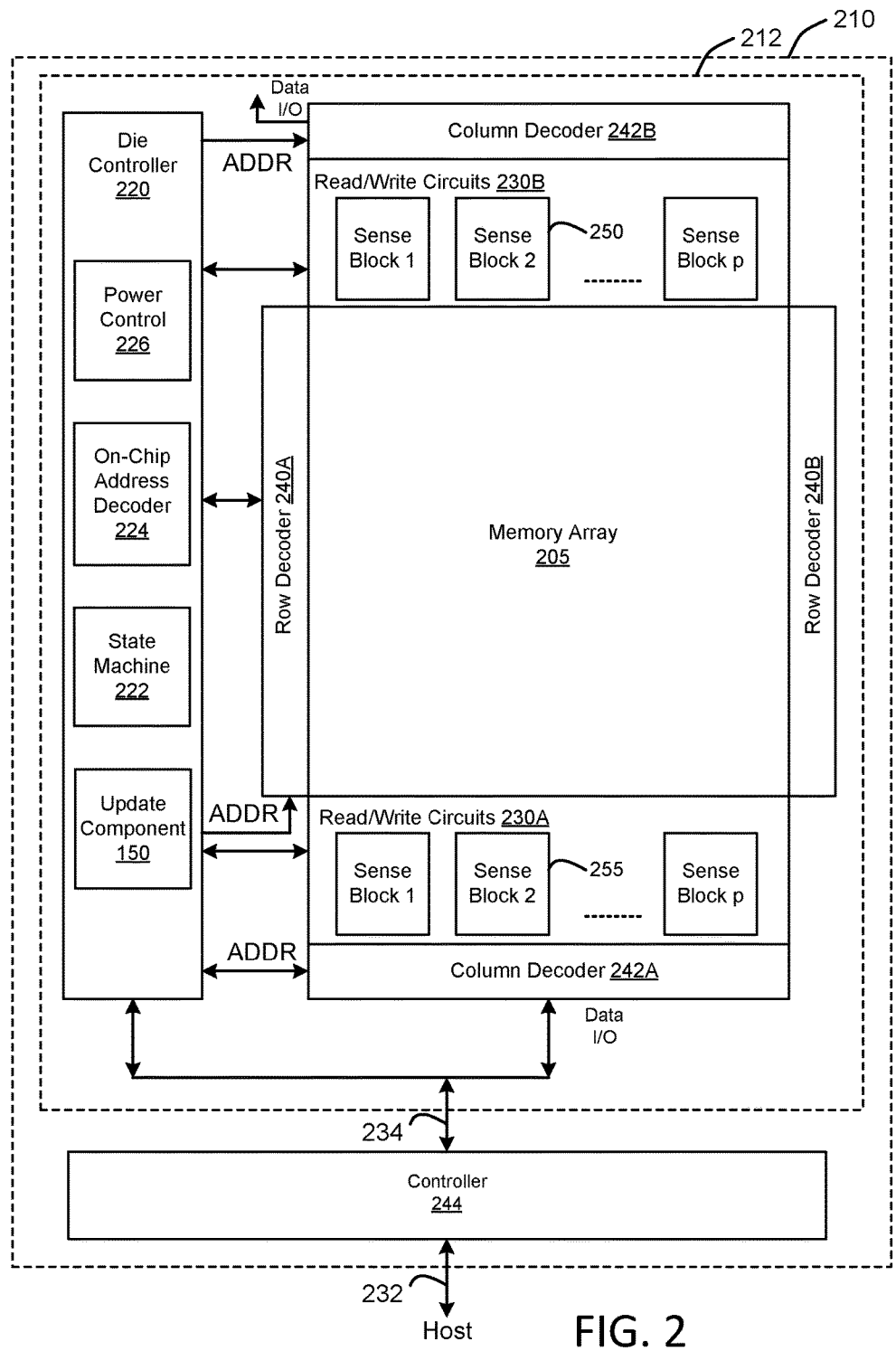
FIG. 2 is a schematic block diagram illustrating another embodiment of a system for updating data of write-in-place storage devices.

FIG. 2 illustrates an embodiment of a storage device 210 that may include one or more memory die or chips 212. Memory die 212, in some embodiments, includes an array (e.g., two-dimensional or three dimensional) of memory cells 205, die controller 220, and read/write circuits 230A/230B. In one embodiment, access to the memory array 205 by the various peripheral circuits is implemented in a symmetric fashion, on opposite sides of the array, so that the densities of access lines and circuitry on each side are reduced by half. The read/write circuits 230A/230B, in a further embodiment, include multiple sense blocks 250 that can allow a page of memory cells to be read or programmed in parallel.

The memory array 205, in various embodiments, is addressable by word lines via row decoders 240A/240B and by bit lines via column decoders 242A/242B. In some embodiments, a controller 244 is included in the same memory device 210 (e.g., a removable storage card or package) as the one or more memory die 212. Commands and data are transferred between the host and controller 244 via lines 232 and between the controller and the one or more memory die 212 via lines 234. One implementation can include multiple chips 212.

Die controller 220, in one embodiment, cooperates with the read/write circuits 230A/230B to perform memory operations on the memory array 205. The die controller 220, in certain embodiments, includes an update component 150, a state machine 222, and an on-chip address decoder 224. In one embodiment, the state machine 222 comprises at least a portion of the update component 150. In a further embodiment, the controller 244 comprises at least a portion of the update component 150. In various embodiments, one or more of the sense blocks 255 comprises at least a portion of the update component 150.

The update component 150, in one embodiment, is configured to update and/or write additional data to a dataset stored in the memory array 205. The update component 150, in certain embodiments, may receive the updated/additional data and calculate a parity for the updated/additional data, which includes the currently stored dataset. The update component 150 may over-write the currently stored dataset with the updated/additional data. The update component 150 may further over-write the current parity for the currently stored dataset with the parity (e.g., new parity) for the updated/additional data.

Furthermore, the update component 150 can over-write the currently stored dataset with the updated/additional data without reading the currently stored dataset prior to such over-write operation(s). Similarly, the update component 150 can over-write the parity for the currently stored dataset with the parity (e.g., the new parity) for the updated/additional data without reading the parity for the currently stored dataset prior to such over-write operation(s). In this manner, the various embodiments of the update component 150 can eliminate, or at least reduce, read overhead when updating and/or adding data to a dataset that is currently being stored in the memory array 205 and/or when over-writing the current parity with a new parity.

The state machine 222, in one embodiment, provides chip-level control of memory operations. The on-chip address decoder 224 provides an address interface to convert between the address that is used by the host or a storage controller to the hardware address used by the decoders 240A, 240B, 242A, and 242B. In certain embodiments, the state machine 222 includes an embodiment of the update component 150. The update component 150, in certain embodiments, is embodied as software in a device driver 125, hardware in a device controller 244, and/or hardware in a die controller 220 and/or state machine 222.

Figure 3:
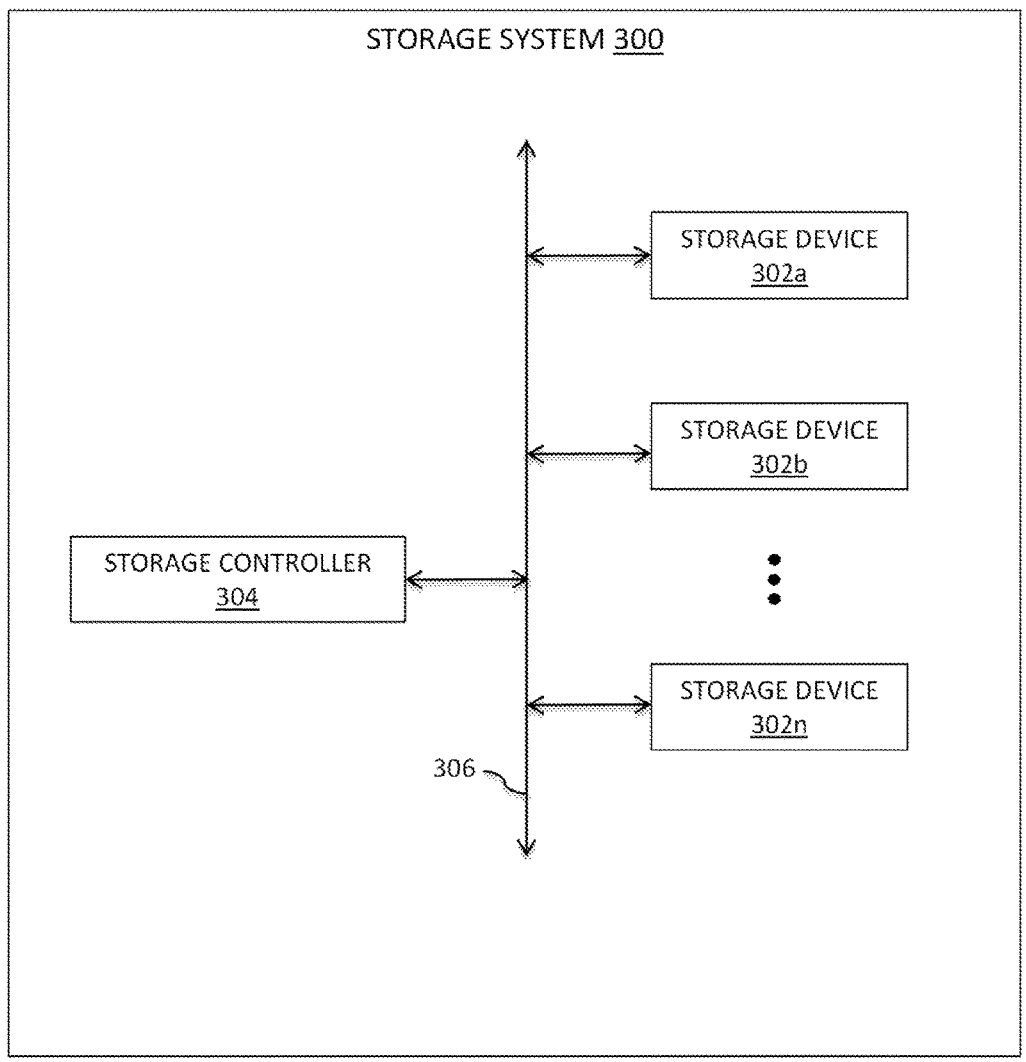
FIG. 3 is a schematic block diagram illustrating one embodiment of a device for updating data of write-in-place storage devices.

With reference to FIG. 3, a block diagram of another embodiment of a storage system 300 is illustrated. As shown, the storage system 300 may include, among other components, one or more storage devices 302a, 302b, . . . 302n (also simply referred to individually, in various groups, or collectively, as storage device(s) 302) and a storage controller 304 coupled to and in communication with the storage device(s) 302 via a wired and/or wireless bus 306.

In various embodiments, the storage device(s) 302 may include any type of write-in-place structure that is known or developed in the future. Example storage devices 302 with a write-in-place structure include, but are not limited to, Memristor memory, programmable metallization cell memory, phase-change memory (PCM, PCME, PRAM, PCRAM, ovonic unified memory, chalcogenide RAM, or C-RAM), RAM, nano RAM or NRAM, nanocrystal wire-based memory, silicon-oxide based sub-10 nanometer process memory, graphene memory, SONOS, PMC, CBRAM, DRAM, SRAM, ReRAM, FRAM, MRAM, CNT-RAM, and/or other SCM, among other types of storage devices that are possible and contemplated herein.

The storage device(s) 302 may include any suitable size that is known or developed in the future. In various embodiments, all of the storage devices 302 include the same size. In other embodiments, at least two storage devices 302 include the same size. In still other embodiments, at least two storage devices 302 include different sizes, which may be static or configurable on the fly. For example, a first storage device may include a size of about 2048 bytes (2 KB) and a second storage device may include a size of about 4 KB. In yet other embodiments, all of the storage devices 302 include different sizes. In one embodiment, the storage device(s) 302 include a size of about four kilobytes (e.g., 4096 bytes), although other sizes are possible and contemplated herein.

In various embodiments, all of the storage devices 302 include the same size. In other embodiments, at least two storage devices 302 include the same size. In yet other embodiments, at least two storage devices 302 include different sizes. In still other embodiments, all of the storage devices 302 include different sizes.

Figure 4:
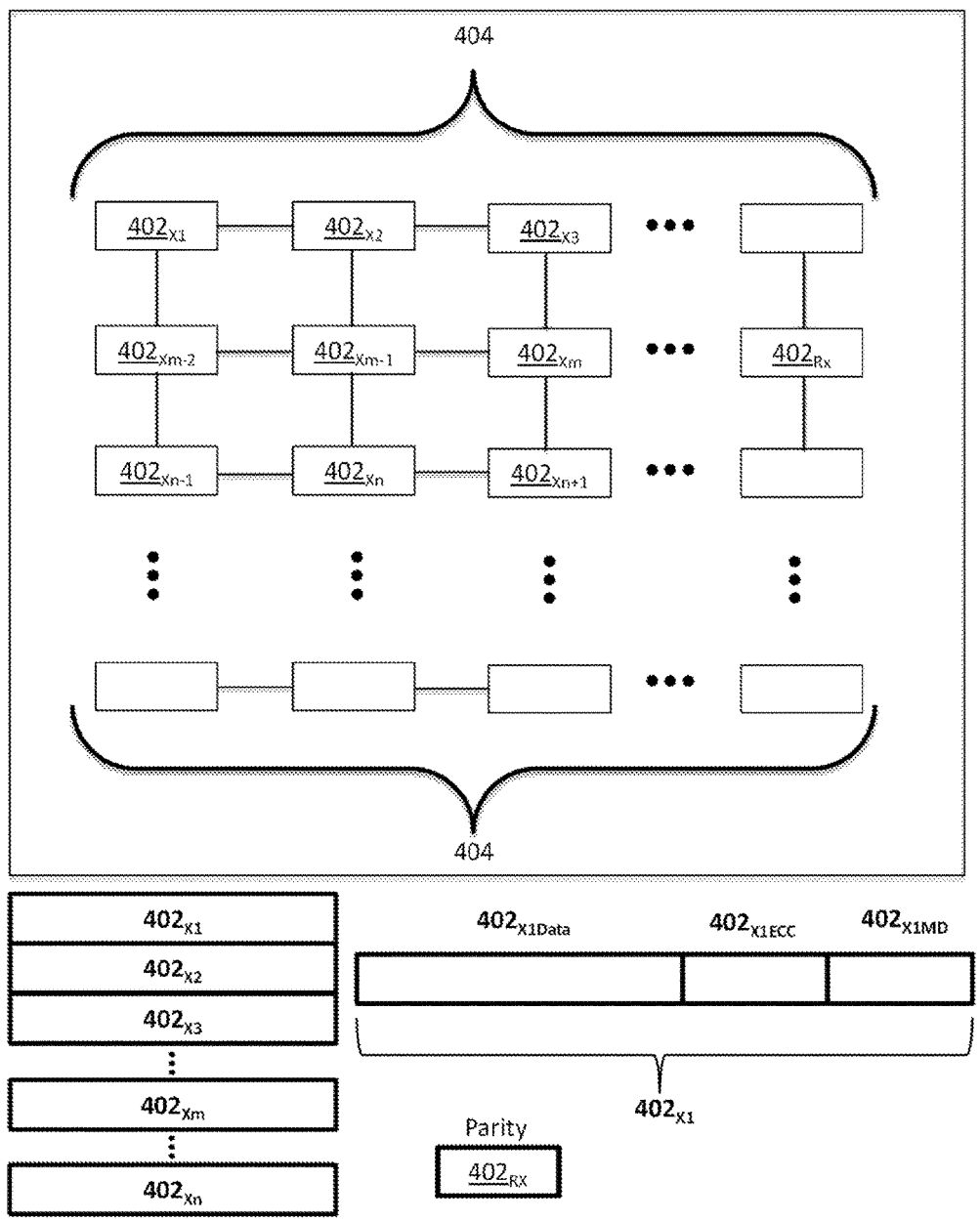
FIG. 4 is a schematic block diagram of a storage device included in the systems of FIGS. 1 and 2 and/or the device of FIG. 3.

With reference to FIG. 4, a storage device 302, in various embodiments, may include a set of non-transitory computer-usable mediums or memory elements 402 (e.g., writable, readable, etc.) arranged in a redundant storage structure 404. A set of memory elements 402 may include any suitable quantity of memory elements 402 that allows data to be redundantly stored in a redundant storage structure 404.

A memory element 402 may include any suitable non-transitory and/or persistent apparatus, components, and/or structure that can contain, store, communicate, propagate, and/or transport instructions, data, computer programs, software, code, routines, etc., for processing by or in connection with a computer processing device. Further, a memory element 402 may include any suitable size that allows a memory element 402 to store data. In some embodiments, a memory element 402 includes a size of about two hundred fifty-six (256) bytes, although other sizes are possible and contemplated herein. That is, a memory element 402 may include a size that is greater than or less than about two hundred fifty-six bytes (256B).

In various embodiments, all of the memory elements 402 of a particular storage device 302 include the same size. In other embodiments, at least two memory elements 402 include the same size. In still other embodiments, at least two memory elements 402 include different sizes. In yet other embodiments, all of the memory elements 402 include different sizes.

A redundant storage structure 404 may include any suitable structure that can provide redundancy to the data stored in the set of memory elements 402. Example redundant storage structures include, but are not limited to, a redundant array of independent disks 3 (RAID 3) structure, a RAID 4 structure, a RAID 5 structure, and a RAID 6 structure, etc., among other types of redundant structures that are possible and contemplated herein.

In various embodiments, a redundant storage structure 404 may allow data to be divided and stored in and/or across one or more stripes among the set of memory elements 402. A redundant storage structure 404 may include any suitable quantity of stripes that allows a set of memory elements 402 to store data. As such, various embodiments can include a redundant storage structure 404 that can store multiple datasets in a set of one or more stripes.

A stripe may include any suitable size that allows a set of memory elements 402 to store data. In various embodiments, all of the stripes of a particular redundant storage structure 304 include the same size. In other embodiments, at least two stripes include the same size. In still other embodiments, at least two stripes include different sizes, which sizes may be static and/or configurable on the fly. In a non-limiting example, a first stripe may be divided across sixteen memory elements 404 (plus one parity memory element 404) and a second stripe may be divided across thirty-two memory elements 404 (plus one parity memory element 404), among other quantities that are possible and contemplated herein. In yet other embodiments, all of the stripes include different sizes. In one embodiment, a stripe includes a size to store 4096 bytes (4 KB) of data or a 4 KB dataset.

A redundant storage structure 404, in various embodiments, includes a parity that allows recovery of data stored on other memory element(s) 402 and/or stripes. In some embodiments, the parity is calculated using an XOR operation and/or calculation, among other types of redundancy operations/calculations that are possible and contemplated herein.

A parity may be stored on one or more memory elements 402. In some embodiments, the parity is stored on a dedicated parity memory element 402 (e.g., RAID 3 and RAID 4 structures). In further embodiments, the parity is distributed among a plurality of memory elements 402 (e.g., a RAID 5 structure) or a set of parities is distributed among a plurality of memory elements 402 (e.g., a RAID 6 structure).

In some embodiments, a storage device 302 includes seventeen memory elements 402. In one embodiment (e.g., in an embodiment using a RAID 3 or RAID 4 structure), sixteen memory elements 402 may be utilized for storing data and one memory element may be dedicated for parity. In other embodiments, a storage device 402 includes sixteen memory elements 402 in which a parity is distributed across the sixteen memory elements 402 (e.g., a RAID 5 structure). In yet other embodiments, a storage device 302 includes sixteen memory elements 402 in which a plurality of parities are distributed across the sixteen memory elements 402 (e.g., a RAID 6 structure).

Although the above embodiments recite specific quantities of memory elements 402 (e.g., sixteen or seventeen memory elements 402), the scope disclosed herein is not limited to such quantities. That is, various other embodiments of a storage device may include greater than seventeen memory elements 402 or less than sixteen memory elements 402.

In some embodiments, a dataset may not evenly divided across a storage device 302. Here, the XOR parity is divided across the storage device 302 in accordance or consistent with the dataset, which affects the write amplification of the updated/additional data.

Returning to FIG. 3, a storage controller 304 may include, among other components, hardware (e.g., one or more processors) and/or software to manage storage operations in the storage system 300. Among other operations, a storage controller 304 can receive data (e.g., a dataset) from the storage client(s) 116 and perform a corresponding I/O operation (e.g., write operations, read operations, deletion operations, etc.) on the storage device(s) 302.

In various embodiments, a storage controller 304 can perform write operations on the storage device(s) 302 to write an original dataset to the storage device(s) 302. Subsequently, the storage controller 304 can receive updates and/or additional data corresponding to the original dataset (and/or a previously updated dataset) stored on the storage device(s) 302, which updated/additional data also includes the original dataset. The storage controller 304, in some embodiments, updates and/or writes the additional data to the storage device(s) 302 by over-writing the original dataset, in its entirety, with the updated and/or additional data. In over-writing the original dataset, a storage controller 304, in some embodiments, may delete the original dataset from the storage device(s) 302 and subsequently write the updated and/or additional data to the space vacated by the deleted original dataset. In other embodiments, a storage controller 304 may over-write and/or directly replace the original dataset with the updated and/or additional data.

In further embodiments, a storage controller 304 can perform write operations on the storage device(s) 302 to update, replace, and/or add a new parity for a dataset that is received for storage on the storage device(s) 302. That is, in response to receipt of the updated/additional data, a storage controller 304 can calculate a parity (e.g., a new parity) for the updated/additional data, which also includes the additional dataset.

A storage controller 304, in some embodiments, can update, replace, and/or add the new parity by over-writing the current parity (e.g., the parity for the original dataset), in its entirety, with the updated, replacement, and/or new parity on the storage device(s) 302. In over-writing the current parity, a storage controller 304, in some embodiments, may delete the current parity from the storage device(s) 302 and subsequently write the updated, replacement, and/or new parity to the space vacated by the deleted current parity. In other embodiments, a storage controller 304 may over-write and/or directly replace the current parity with the new parity in the space vacated by the deleted current parity.

For example, upon receipt of updated and/or additional data for a dataset currently stored on the storage device(s) 302, a storage controller 304 may calculate a parity (e.g., a new parity) for the updated/additional data. The storage controller 304 may delete the dataset currently stored on the storage device(s) 302 corresponding to the updated data and delete the parity for the data currently stored on the storage device(s) 302. The storage controller 304 can further write and/or over-write the updated/additional data, which includes the original data, and the new parity to the storage device(s) 302 in accordance with a redundant storage structure and/or configuration (e.g., RAID 3, RAID 4, RAID 5, RAID 6, etc.).

While the storage controller 304 in the above example appears to perform various operations in a particular order, a storage controller 304 is limited to such order. That is, a storage controller 304 may perform deletion operations of the stored dataset and its corresponding parity prior to and/or subsequent to calculating the new parity for the updated/additional data.

A storage controller 304 may write and/or transfer data with any suitable size and/or rate that is known or developed in the future. Example sizes include, but are not limited to, 256B, 512B, 1024B, 2048B, 4 KB, etc., among other sizes and/or rates that are possible and contemplated herein.

In various embodiments, a storage controller 304 can delete the original data and its corresponding parity and write the updated/additional data and its corresponding updated/new parity without reading the original data and its corresponding parity from the storage device(s) 302 to, for example, a buffer (not shown) of the storage controller 304. In other words, a storage controller 304 can over-write an original dataset and over-write its corresponding parity stored on the storage device(s) 302 with updated/additional data and a new parity, respectively, without performing a read operation, which can reduce or eliminate I/O overhead (e.g., read overhead). By reducing or eliminating I/O overhead, the various embodiments of the storage system 200 and/or the storage controller 304 can improve the operations of a storage system, apparatus, and/or device. Specifically, by reducing or eliminating read overhead when updating data currently stored in the storage device(s) 302, the various embodiments disclosed herein can conserve resources that allows the storage system 200 and/or storage controller 304 to be more efficient, secure, reliable, and/or includes reduced latency than the conventional storage systems and/or storage controllers discussed in the Background section of this paper.

For example, various embodiments can operate at a speed of about 6.4 GBps, which is faster than the 4.8 GBps of some conventional storage systems and/or storage controllers that have read overhead. Also, because the parity memory element 402 is updated/written to the same quantity as the other memory elements, all of the memory element(s) 402 wear at the same rate, which can eliminate, or at least reduce, the occurrence of "hot spots" in which a parity memory element 402 wears faster than other memory elements because the parity is written to more frequently than other memory elements 402.

Figure 5:
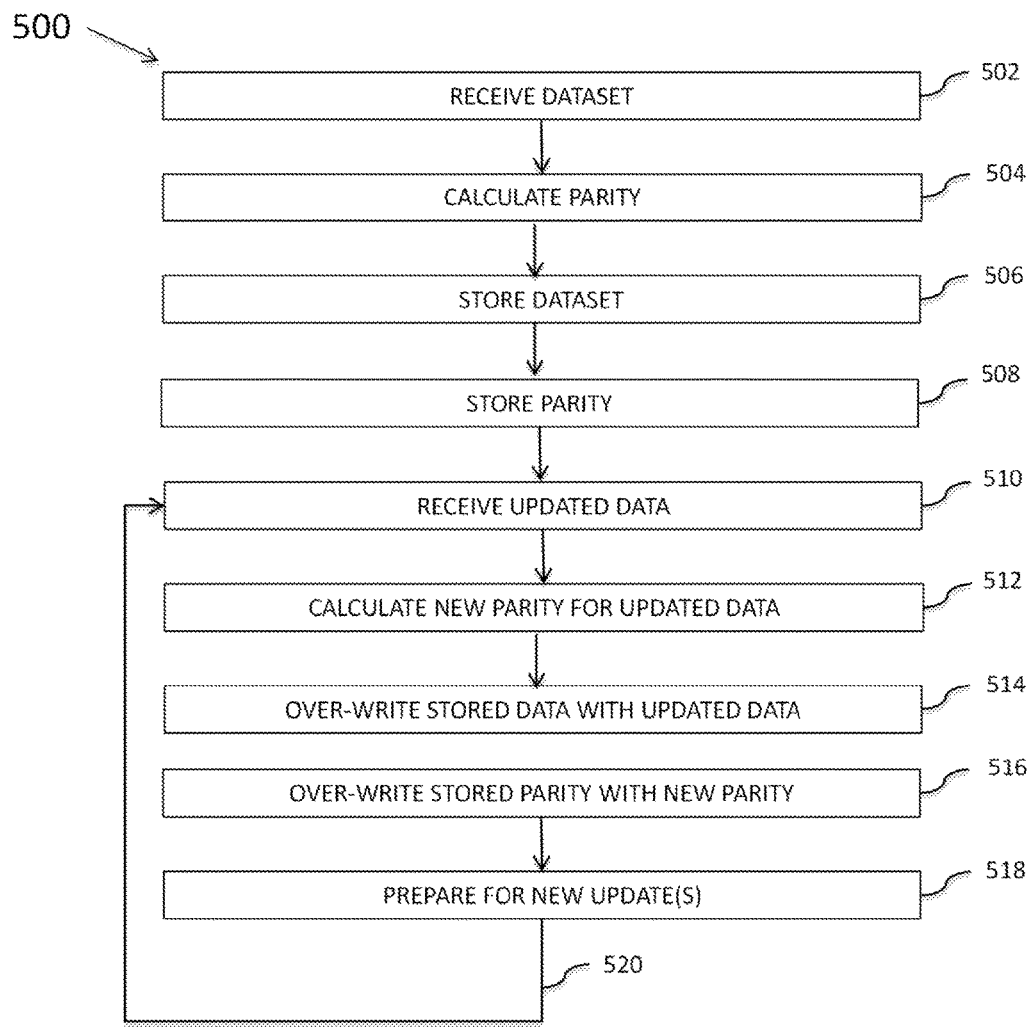
FIG. 5 is a schematic flow chart diagram illustrating one embodiment of a method for updating data of Write-in-Place storage devices.

With reference to FIG. 5, FIG. 5 is a schematic flow chart diagram illustrating one embodiment of a method 500 for updating data in redundant storage structures 304 of write-in-place storage devices 302. At least in the illustrated embodiment, method 500 can begin by a storage controller 304 receiving a dataset (e.g., an original dataset) for storage in one or more storage devices 302 of a storage system 300 (block 502).

The storage controller 304 can calculate a parity (e.g., a current parity) for the original dataset (block 504). The original dataset is stored on the storage device(s) 302, as discussed elsewhere herein (block 506). The current parity is also stored on the storage device(s) 302, as discussed elsewhere herein (block 508).

Subsequently, the storage controller 304 receives updates and/or additional data for the original dataset or an updated version of the original dataset (both of which can be referred to as the currently stored dataset) (block 510). In response thereto, the storage controller 304 calculates a parity (e.g., a new parity) for the updated/additional data, which includes the original dataset and/or the updated version of the original dataset (block 512).

The storage controller 304 over-writes and/or replaces the currently stored dataset with the updated/additional data (block 514). The currently stored dataset may be over-written, deleted, and/or replaced with the updated/additional data in accordance with any of the embodiments discussed elsewhere herein.

The storage controller 304 also overwrites the parity (e.g., the current parity) for the currently stored dataset with the new parity (block 516). The current parity may be over-written, deleted, and/or replaced with the new parity in accordance with any of the embodiments discussed elsewhere herein.

The storage controller 304 may then prepare for receipt of subsequent updates and/or additional data for the currently stored dataset (block 518). The method 500 may then repeat blocks 510 through 518 (return 520).

Figure 6:
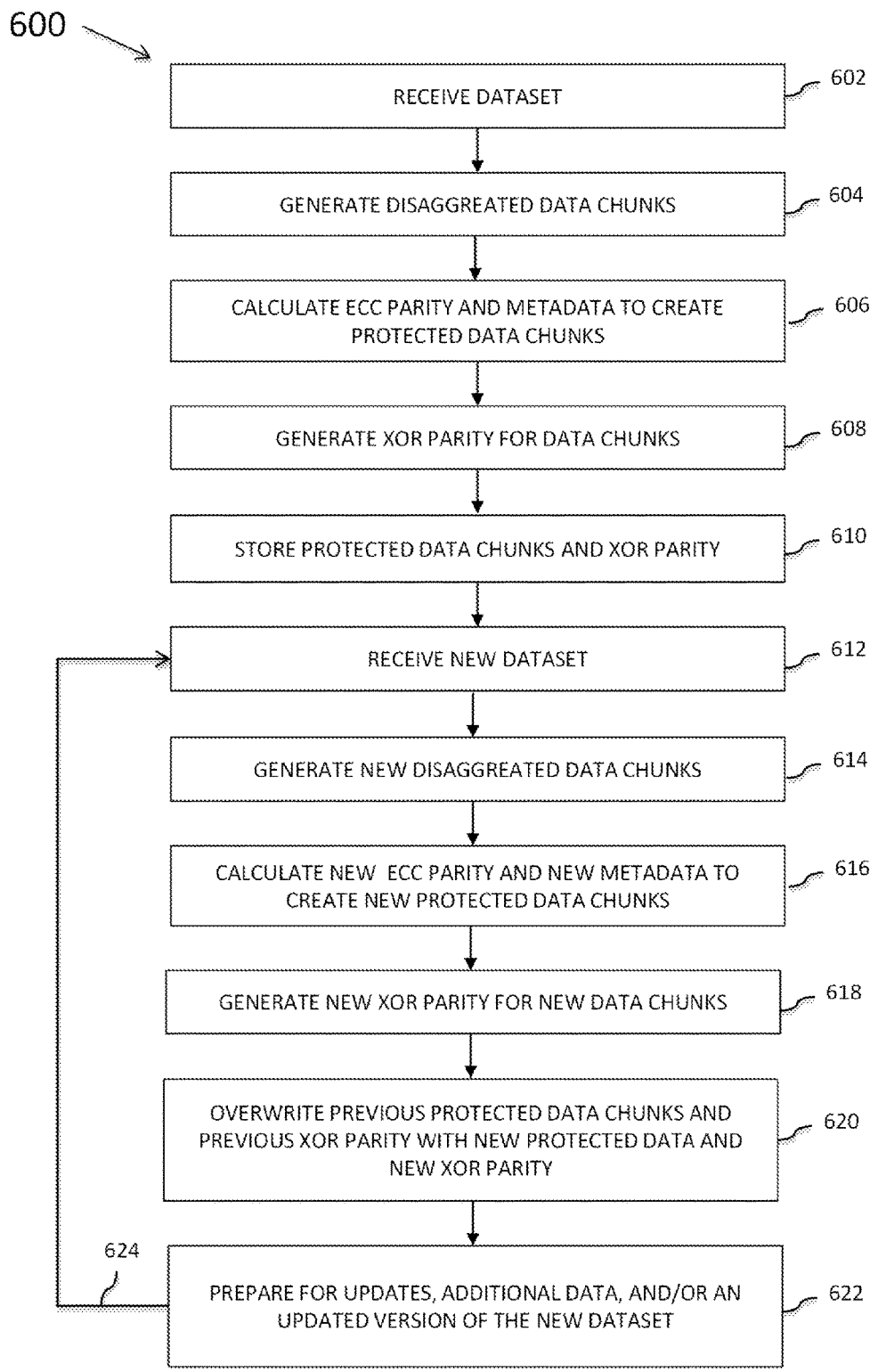
FIG. 6 is a schematic flow chart diagram illustrating another embodiment of a method for updating data of Write-in-Place storage devices.

Referring to FIG. 6, FIG. 6 is a schematic flow chart diagram illustrating another embodiment of a method 600 for updating data in redundant storage structures 304 of Write-in-Place storage devices 302. At least in the illustrated embodiment, method 600 can begin by a storage controller 304 receiving a dataset (e.g., an original dataset) for storage in one or more storage devices 302 of a storage system 300 (block 602).

The storage controller 304 generates disaggregated data chunks for the dataset (block 604). An Error Correction Code (ECC) parity and metadata are calculated and/or generated for the data chunks to create protected data chunks (block 606). An XOR parity is calculated and/or generated for the protected data chunks (block 608) and the protected data chunks and XOR parity are stored in one or more memory elements 123, which can include Write-in-Place NVM elements (block 610).

Subsequently, the storage controller 304 receives updates and/or additional data for the original dataset or an updated version of the original dataset (both of which can be referred to as the currently stored dataset), which can be considered a new dataset (block 612), and generates new disaggregated data chunks for the new dataset (block 614). An ECC parity and metadata is calculated and/or generated for the new data chunks to create new protected data chunks (block 616).

A new XOR parity and new metadata are calculated and/or generated for the new protected data chunks (block 618) and the previous protected data chunks and the previous XOR parity are overwritten with the new protected data chunks and the new XOR parity (block 620). In other words, the new protected data chunks and the new XOR parity are stored in the one or more memory elements 123. In some embodiments, the new protected data chunks and the new XOR parity are written over the same set of memory elements 123 (e.g., Write-in-Place NVM elements) as the previous protected data chunks and the previous XOR parity.

The storage controller 304 may then prepare for updates and/or further additional data for the new dataset or an updated version of the new dataset (block 622). Blocks 612-622 may then be repeated in response to receiving any updates and/or additional data for the new dataset or an updated version of the new dataset (return 624).

A means for reducing or eliminating read overhead, in various embodiments, may include one or more of redundant storage structures 304, write-in-place storage devices 302, a memory media controller 126, a storage controller 304 (e.g., a device driver 125, or the like) executing on a computing system 100 or storage device 300, a processor 111, an FPGA, an ASIC, other logic hardware, and/or other executable code stored on a computer-readable storage medium. Other embodiments may include similar or equivalent means for reducing or eliminating read overhead.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. A system, comprising:
a write-in-place memory device comprising a redundant storage structure, the memory device configured to store data across a set of stripes of the redundant storage structure; and
a controller for the memory device, the controller configured to:
receive updated data for at least one portion of a plurality of portions of a dataset stored across a first stripe, each portion of the plurality of portions comprising respective error correction code (ECC) parity;
generate a new parity for the at least one portion based on the updated data without reading the at least one portion of the dataset from the first stripe; and
overwrite the at least one portion of the dataset across the first stripe with the updated data and the new parity.

2. The system of claim 1, wherein the controller is configured to generate the new parity without reading the dataset from the first stripe.

3. The system of claim 1, wherein the controller is configured to generate the new parity without reading a previous parity for the dataset.

4. The system of claim 3, wherein the controller is configured to generate the new parity without reading the dataset from the first stripe.

5. The system of claim 1, wherein the controller is configured to overwrite the dataset with the updated data without reading the dataset from the first stripe.

6. The system of claim 1, wherein the controller is configured to write the new parity to one of the first stripe and a second stripe that is different from the first stripe.

7. The system of claim 1, wherein the redundant storage structure comprises one of a RAID 3, a RAID 4, a RAID 5, and a RAID 6 structure.

8. The system of claim 1, wherein the write-in-place memory device comprises a random access memory (RAM) device comprising one or more of a dynamic RAM (DRAM) device, a static RAM (SRAM) device, a resistive RAM (ReRAM) device, a ferroelectric RAM (FRAM) device, a phase change memory (PCM) device, a magnetoresistive RAM (MRAM) device, a carbon nanotube RAM (CNT-RAM) device, and a programmable metallization cell (PMC) device.

9. The system of claim 1, wherein the new parity is an XOR parity.

10. The system of claim 1, wherein:
the dataset is stored across the first stripe in a predetermined quantity of same size data chunks; and
the new parity has the same size as one of the same size data chunks.

11. The system of claim 10, wherein:
the memory device comprises a predetermined quantity of memory elements, wherein each memory element in the predetermined quantity of memory elements is the same size; and
each memory element stores a respective one of the same size data chunks.

12. The system of claim 11, wherein:
the dataset comprises 4096 bytes;
the memory device comprises 17 memory elements;
the new parity is stored on one memory element of the 17 memory elements and the first stripe is stored across the remaining 16 memory elements; and
the same size of each of the same size data chunks and of the new parity comprises 256 bytes each.

13. An apparatus, comprising:
means for receiving an updated dataset for a dataset stored across a subset of a first stripe in a redundant array of independent disks (RAID) structure of a random access memory (RAM) device, the subset and one or more additional subsets of the first stripe comprising respective error correction code (ECC) parity;
means for generating a new parity for the updated dataset without reading the dataset from the subset of the first stripe;
means for over-writing the dataset across the subset of the first stripe with the updated dataset; and
means for writing the new parity to the set of stripes.

14. The apparatus of claim 13, wherein the generating means comprises means for generating the new parity without reading the dataset from the first stripe and without reading a previous parity for the dataset.

15. The apparatus of claim 13, wherein the over-writing means comprises means for writing the updated dataset across the first stripe without reading the dataset from the first stripe.

16. The apparatus of claim 13, wherein:
the RAID structure comprises one of a RAID 3, a RAID 4, a RAID 5, and a RAID 6 structure;
the RAM device comprises one of a dynamic RAM (DRAM) device, a static RAM (SRAM) device, a resistive RAM (ReRAM) device, a ferroelectric RAM (FRAM) device, a phase change memory (PCM) device, a magnetoresistive RAM (MRAM) device, a carbon nanotube RAM (CNT-RAM) device, and a programmable metallization cell (PMC) device; and
the new parity is an XOR parity.

17. A method, comprising:
receiving, via a controller, an updated portion of a dataset stored across a first stripe in a redundant array structure of a random access memory device, each portion of a plurality of portions of the dataset comprising respective error correction code (ECC) parity;
generating a new parity for the updated portion of the dataset without reading the portion from the first stripe;
over-writing the portion of the dataset across the first stripe with the updated portion of the dataset; and
writing the new parity to the set of stripes.

18. The method of claim 17, wherein generating the new parity comprises generating the new parity without reading the dataset from the first stripe.

19. The method of claim 18, wherein generating the new parity further comprises generating the new parity without reading a previous parity for the dataset.

20. The method of claim 17, wherein over-writing the dataset comprises writing the updated dataset across the first stripe without reading the dataset from the first stripe.

* * * * *